US012402267B1

(12) United States Patent
Shi

(10) Patent No.: US 12,402,267 B1
(45) Date of Patent: Aug. 26, 2025

(54) COMPUTER CASE WITH GRAPHICS CARD HOLDER

(71) Applicant: HeXin Shi, Shaoyang (CN)

(72) Inventor: HeXin Shi, Shaoyang (CN)

(*) Notice: Subject to any disclaimer, the term of this patent is extended or adjusted under 35 U.S.C. 154(b) by 0 days.

(21) Appl. No.: 19/064,455

(22) Filed: Feb. 26, 2025

(30) Foreign Application Priority Data

Feb. 28, 2024 (CN) .......................... 202420366050.0

(51) Int. Cl.
*H05K 7/14* (2006.01)
*G06F 1/18* (2006.01)

(52) U.S. Cl.
CPC ........... *H05K 7/1461* (2013.01); *G06F 1/183* (2013.01)

(58) Field of Classification Search
None
See application file for complete search history.

(56) References Cited

U.S. PATENT DOCUMENTS

| | | | | |
|---|---|---|---|---|
| 8,248,770 B2* | 8/2012 | Tung | ....................... | G06F 1/186 361/732 |
| 2002/0044420 A1* | 4/2002 | Chen | ....................... | H05K 5/30 361/679.4 |
| 2008/0055876 A1* | 3/2008 | Fan | ....................... | G06F 1/185 361/801 |
| 2013/0027891 A1* | 1/2013 | Fan | ....................... | G06F 1/186 361/748 |
| 2013/0107441 A1* | 5/2013 | Zhou | ....................... | G06F 1/185 248/298.1 |
| 2013/0161274 A1* | 6/2013 | Lu | ....................... | G06F 1/186 211/41.17 |
| 2015/0115120 A1* | 4/2015 | Yu | ....................... | G06F 1/186 248/220.21 |
| 2024/0260221 A1* | 8/2024 | Tsorng | ................. | H05K 7/1487 |
| 2024/0341050 A1* | 10/2024 | Lu | ....................... | G06F 1/186 |

FOREIGN PATENT DOCUMENTS

| | | | | |
|---|---|---|---|---|
| CN | 114077290 A | * | 2/2022 | ............ G06F 1/183 |
| KR | 102258189 B | * | 5/2021 | |

* cited by examiner

*Primary Examiner* — Allen L Parker
*Assistant Examiner* — Christopher L Augustin
(74) *Attorney, Agent, or Firm* — JEEN IP LAW, LLC

(57) ABSTRACT

A computer case with a graphics card holder is provided, which includes a computer case body and a graphics card holder. The graphics card holder includes a first support member, a second support member, and a third support member. The first support member is slidably connected to a fixing member, the second support member is vertically provided at one end of the first support member, the second support member is provided with a graphics card adapter cable. One side of the third support member away from the first support member is fixedly connected to the computer case body. By setting the graphics card holder and fixing component, the computer case can stably fix the graphics card. The setting of the graphics card adapter cable allows the graphics card to be placed vertically, thereby enhancing the heat dissipation performance of the graphics card.

8 Claims, 6 Drawing Sheets

COMPUTER CASE WITH GRAPHICS CARD HOLDER

CROSS-REFERENCE TO RELATED APPLICATIONS

This application claims priority to Chinese Patent Application No. 202420366050.0, filed on Feb. 28, 2024, which is hereby incorporated by reference in its entirety.

TECHNICAL FIELD

The present disclosure relates to the field of computer case products technologies, and in particular, to a computer case with a graphics card holder.

BACKGROUND

At present, conventional graphics cards are connected to the computer case motherboard in a horizontal manner, so they are basically placed horizontally, that is, the graphics card is vertically arranged with the computer case motherboard. The main disadvantage of horizontal placement is that the fan is placed at a bottom of the graphics card, and the hot air discharged by the fan floats upward while the fan blows downward, which causes the airflow to be obstructed and results in poor heat dissipation performance of the graphics card. In addition, the horizontal placement of the graphics card is unstable, and it is easy to bend and deform at a connection between the graphics card and the motherboard of the computer case, which affects the performance of the computer. Furthermore, because the fan is at the bottom, the colorful and cool fan cannot be visually seen, which reduces the visual beauty of the computer case.

SUMMARY

To solve problems of poor heat dissipation performance, unstable graphics card fixation, and low visual aesthetics in most computer cases.

The present disclosure provides a computer case with a graphics card holder, including a computer case body and a graphics card holder, where the graphics card holder includes a first support member, a second support member, and a third support member; the first support member is slidably connected to a fixing member, the second support member is vertically provided at one end of the first support member, the second support member is provided with a graphics card adapter cable, the third support member is vertically provided on one side of the first support member, and one side of the third support member away from the first support member is fixedly connected to the computer case body.

In some embodiments of the present disclosure, the second support member is a right-angled trapezoidal structure, and one right-angled side of the second support member is connected to the first support member.

In some embodiments of the present disclosure, a threading port with a size larger than the graphics card adapter cable is provided on one side of the first support member near the second support member.

In some embodiments of the present disclosure, the fixing member is integrally formed and bent to form a shape of , at least two sliding holes are provided on one side of the fixing member, and a graphics card fixing hole is provided on the other side.

In some embodiments of the present disclosure, at least two parallel sliding grooves are provided on one side of the first support member near the third support member, and number and positions of the sliding grooves are corresponding to those of the sliding holes.

In some embodiments of the present disclosure, a distance between the first support member and a computer case motherboard is 4 cm to 8 cm.

In some embodiments of the present disclosure, one side of the third support member away from the first support member is provided with a first fixing hole, and the computer case body is provided with a second fixing hole corresponding to the first fixing hole.

In some embodiments of the present disclosure, one side of the second support member is bent to form a PCI bracket that is vertically fixed to the first support member and the second support member, two ends of the PCI bracket away from the first support member and the second support member are provided with third fixing holes, the computer case body is provided with fourth fixing boles that match with the third fixing holes.

In some embodiments of the present disclosure, the PCI bracket is provided with at least two PCI card slots, the PCI bracket is further provided with at least two first connection holes, the PCI card slot is provided with second connection holes, and number and positions of first connection holes are correspond to those of the second connection holes.

In some embodiments of the present disclosure, the computer case body is provided with at least one transparent side panel.

The beneficial effects of the present disclosure are reflected in the stable fixation of the graphics card in the computer case through the setting of the graphics card holder and fixing member, and the vertical placement of the graphics card adapter cable, which enhances the heat dissipation performance of the graphics card and renders the colorful and cool fans visible intuitively, thereby solving problems of poor heat dissipation performance, unstable graphics card fixation, and low visual aesthetics in most computer case.

BRIEF DESCRIPTION OF DRAWINGS

The accompanying drawings are used to provide further understanding of the present disclosure and form a part of the specification. They are used together with the embodiments of the present disclosure to explain the present disclosure and do not constitute limitations on the present disclosure.

Numeral reference: 1—computer case body; 11—second fixing hole; 12—fourth fixing hole; 2—graphics card holder; 21—first support member; 211—fixing member; 2111—sliding hole; 2112—graphics card fixing hole; 212—threading port; 213—sliding grooves; 22—second support member; 221—graphics card adapter cable; 222—PCI bracket; 2221—third fixing hole; 2222—first connection hole; 223—

PCI card slot; 2231—second connection hole; 23—third support member; 231—first fixing hole.

DESCRIPTION OF EMBODIMENTS

The following will provide a clear and complete description of the technical solution in the embodiments of the present application, combined with the accompanying drawings. Obviously, the described embodiments are only a part of the embodiments of the present application, not all of them. Based on the embodiments in this application, all other embodiments those skilled in the art without creative work are within the protection scope of this application.

Figure 1:
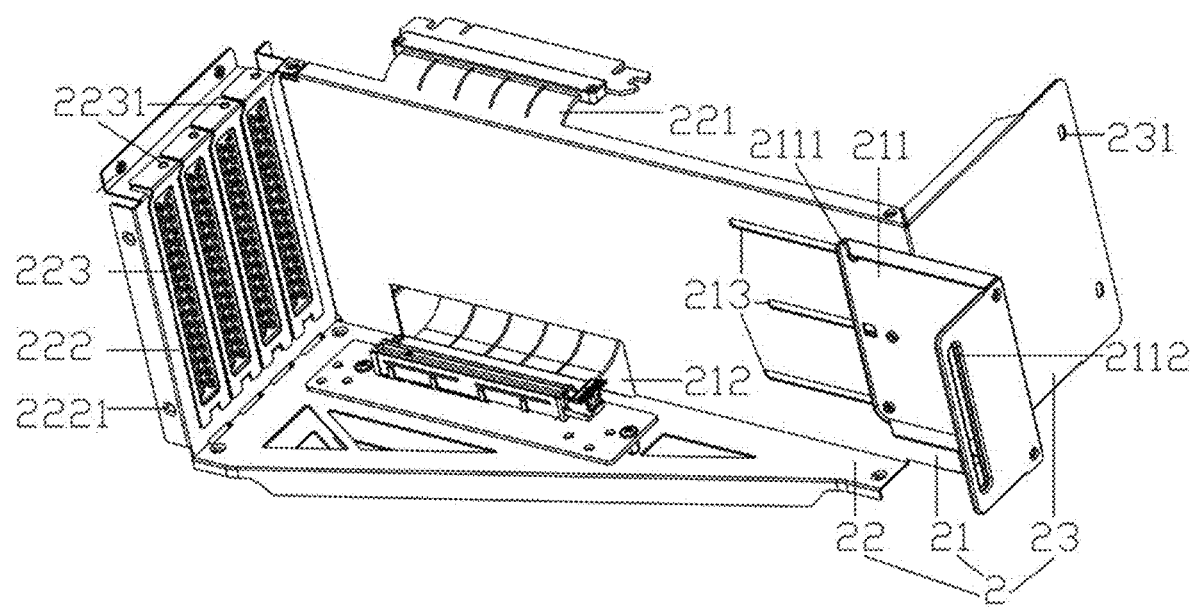
FIG. 1 is a perspective view of a graphics card holder provided by the present disclosure.
Figure 6:
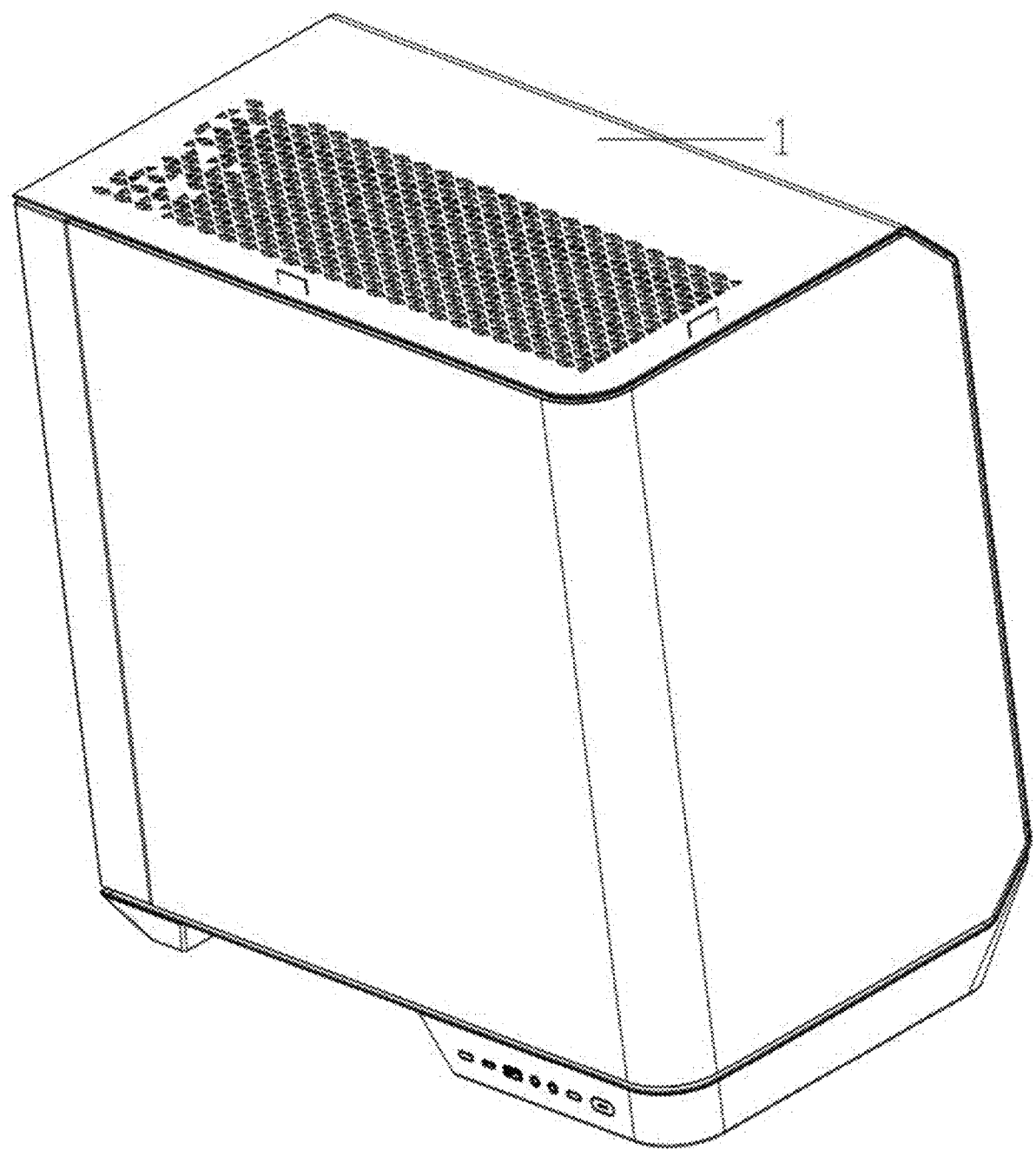
FIG. 6 is a perspective view of a computer case with the graphics card holder.

Referring to FIGS. 1 and 6, a computer case with a graphics card holder includes a computer case body 1 and a graphics card holder 2. The graphics card holder 2 includes a first support member 21, a second support member 22, and a third support member 23. The first support member 21 is slidably connected to a fixing member 211, the second support member 22 is vertically provided at one end of the first support member 21, the second support member 22 is provided with a graphics card adapter cable 221, and the third support member 23 is vertically provided on one side of the first support member 21. One side of the third support member 23 away from the first support member 21 is fixedly connected to the computer case body 1.

Figure 2:
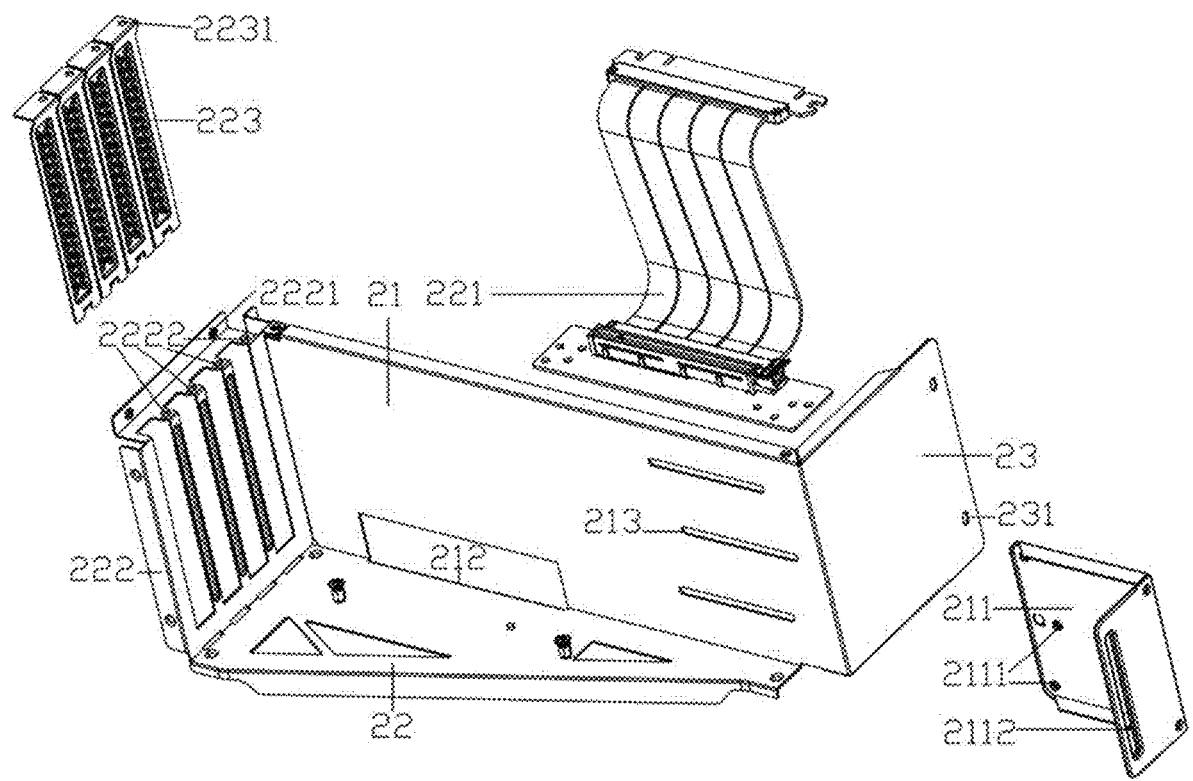
FIG. 2 is an exploded view of FIG. 1.
Figure 3:
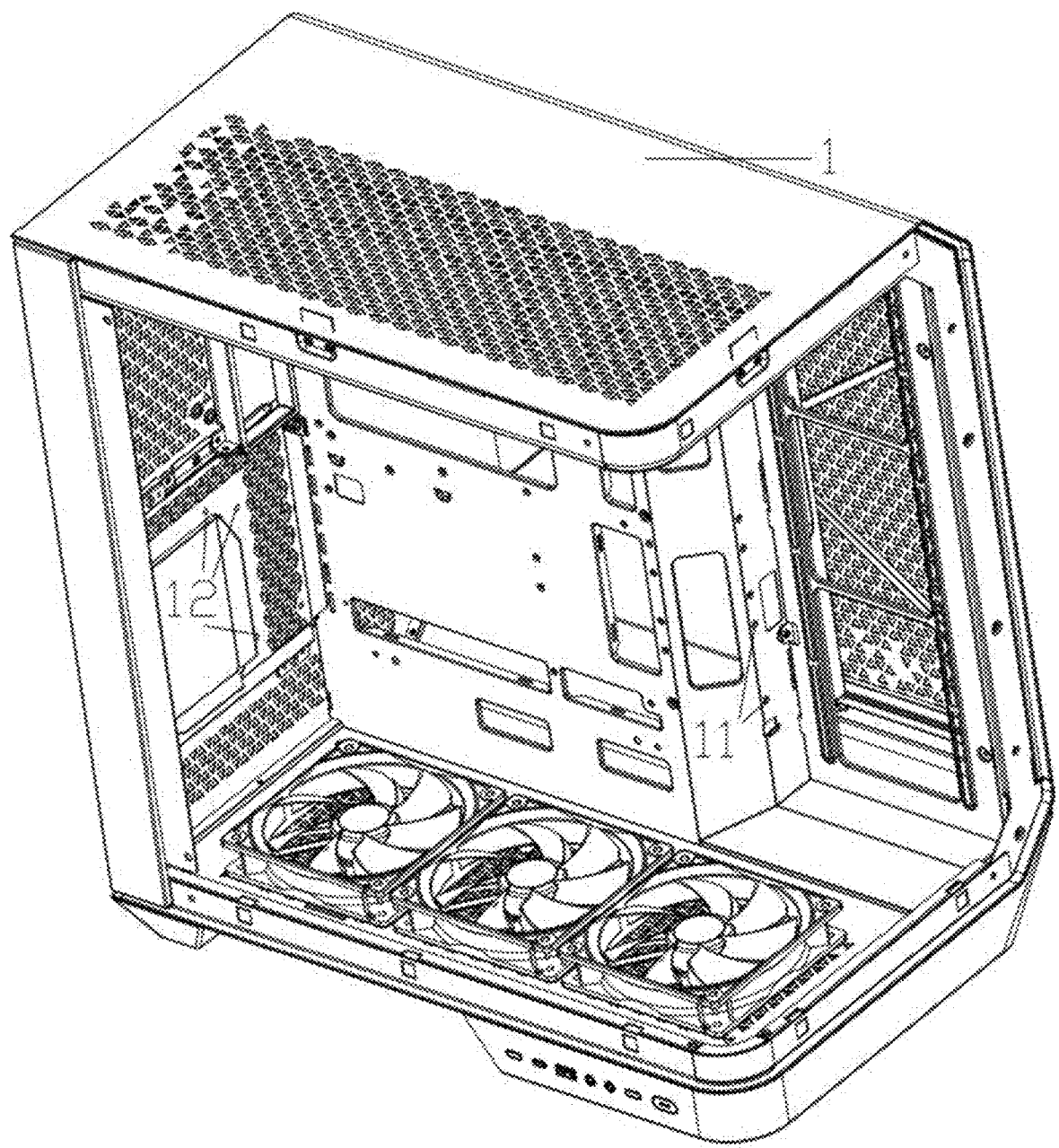
FIG. 3 is a perspective view of a computer case body provided by the present disclosure.
Figure 4:
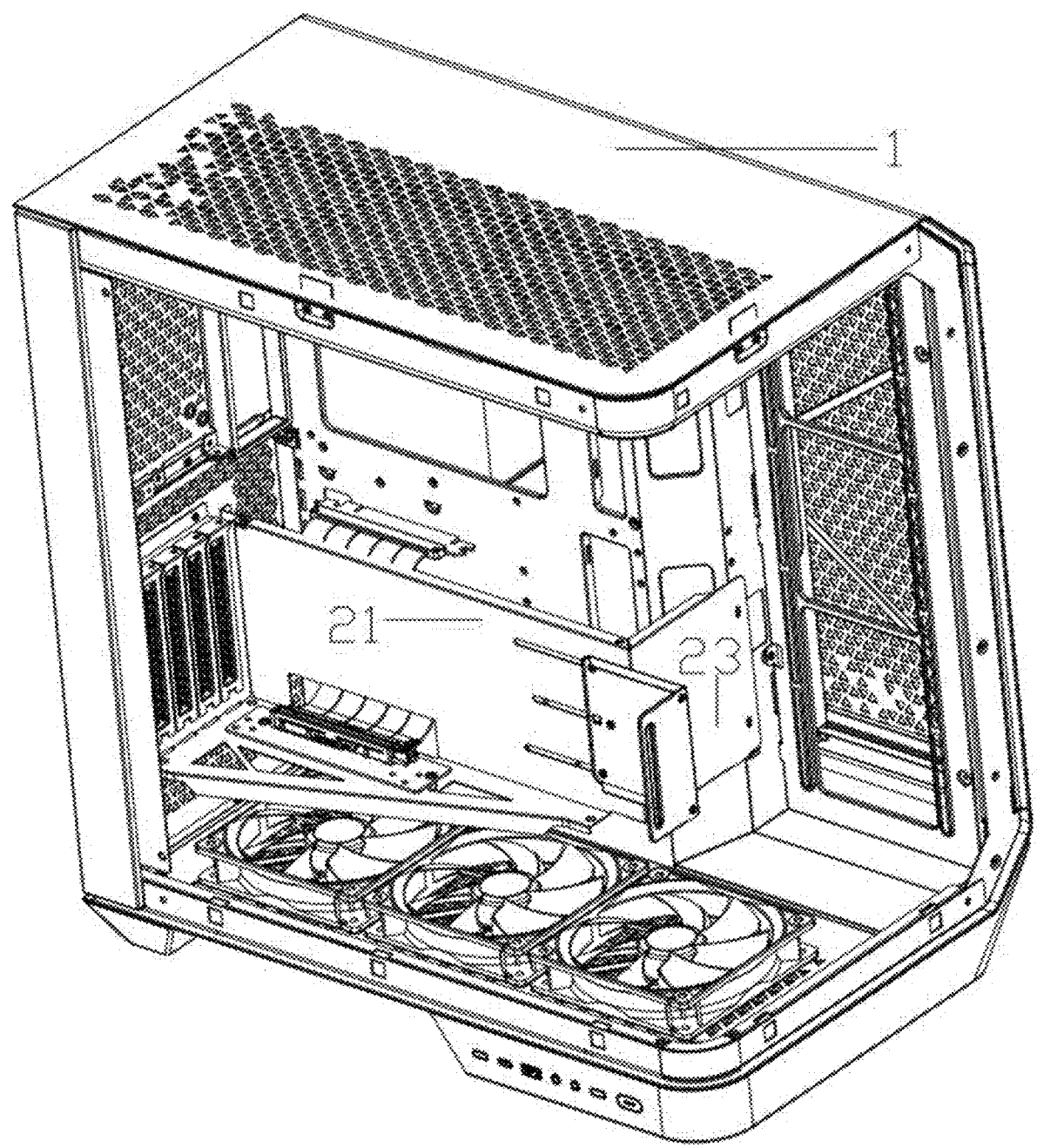
FIG. 4 is a perspective view of the graphics card holder installed on the computer case body.
Figure 5:
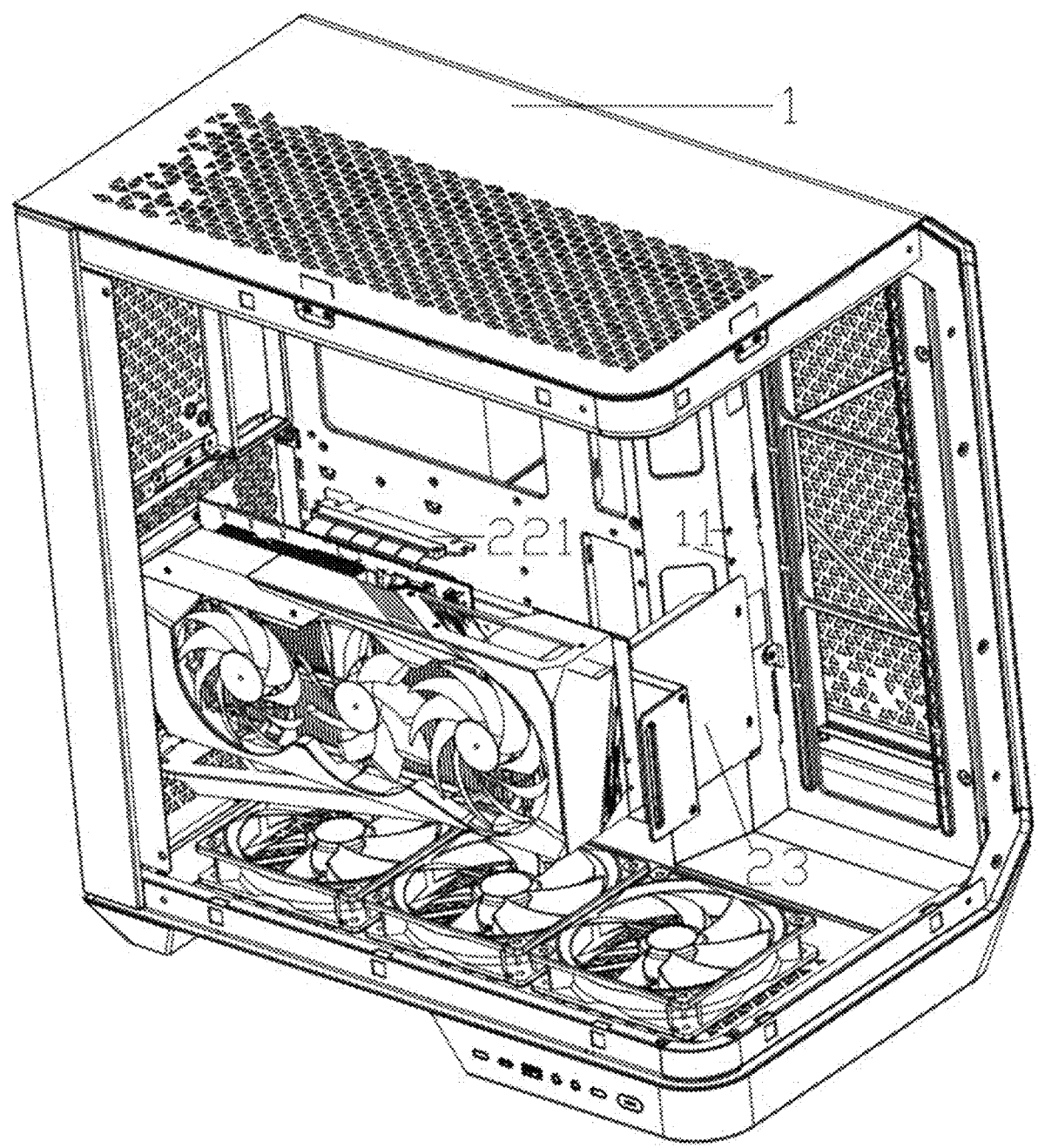
FIG. 5 is a perspective view of a graphics card vertically placed on the computer case with a graphics card holder.

As shown in FIG. 2, the graphics card holder 2 is integrally formed and bent to form the first support member 21, the second support member 22, and the third support member 23. The graphics card adapter cable 221 is fixed to one end of the second support member 22 and connected to the graphics card bracket, and the other end thereof is connected to the graphics card slot on a computer case motherboard. In an implementation mode, the third support member 23 is vertically provided on one side of the first support member 21 away from the second support member 22.

As shown in FIG. 2, in some embodiments, the second support member 22 is a right-angled trapezoidal structure, and one right-angled side of the second support member 22 is connected to the first support member 21.

As shown in FIGS. 1 and 2, the right-angled trapezoidal structure of the second support member 22 ensures that the second support member 22 supports the graphics card through the graphics card adapter cable 221 while reducing the space occupied by the second support member 22 in the computer case body 1.

In some embodiments, a threading port 212 with a size larger than the graphics card adapter cable 221 is provided on one side of the first support member 21 near the second support member 22.

One end of the graphics card adapter cable 221 is fixed to the second support member 22, and the other end thereof is connected to the graphics card slot on the computer case motherboard through the threading port 212. The setting of the threading port 212 renders it more convenient for the graphics card adapter cable 221 to pass through the first support member 21 without extending a length of the graphics card adapter cable 221. The setting of the threading port 212 and the graphics card adapter cable 221 enables the first support member 21 to separate the graphics card from the computer case motherboard without affecting the connection between the graphics card and the computer case motherboard, thereby achieving isolation of the main heating function modules such as the CPU on the graphics card and the computer case motherboard, and achieving better heat dissipation effect for each of the main heating function modules such as the graphics card and CPU.

In some embodiments, the fixing component 211 is integrally formed and bent to form a right angle. At least two sliding boles 2111 are provided on one side of the fixing member 211, and a graphics card fixing hole 2112 is provided on the other side. In an implementation mode, there are three vertically spaced sliding holes 2111, and the graphics card fixing bole 2112 is a vertically arranged elongated hole.

In some embodiments, at least two parallel sliding grooves 213 are provided on one side of the first support member 21 near the third support member 23, and number and positions of the sliding grooves 213 are corresponding to those of the sliding holes 2111. In an implementation mode, there are three vertically arranged sliding groove 213 with equal spacing. The fixing member 211 is fixed to the first support member 21 through a bolt that passes through the sliding holes 2111 and the sliding grooves 213. The fixing member 211 can be flexibly on the first support member 21, the fixing member 211 can be adjusted in position along the sliding grooves 213 on the first support member 21 to match graphics cards of different sizes. The setting of multiple sliding grooves 213 and the sliding holes 2111 renders the sliding of the fixing member 211 smoother, and a connection between the fixing member 211 and the first support member 21 more secure, thereby rendering the fixing member 211 more stably support the graphics card.

In some embodiments, a distance between the first support member 21 and the computer case motherboard is 4 cm to 8 cm. The computer case motherboard is mounted on the computer case body 1, and the distance between the first support member 21 and the computer case motherboard ensures that the computer case motherboard has a larger heat dissipation space, achieving better heat dissipation effect and thus improving the performance of the computer case motherboard.

In some embodiments, one side of the third support member 23 away from the first support member 21 is provided with a first fixing hole 231, and the computer case body 1 is provided with a second fixing hole 11 corresponding to the first fixing hole 231. By the bolt passing through first fixing hole 231 and the second fixing bole 11, the third support member 23 is fixedly connected to the computer case body 1, thereby fixing the graphics card holder 2 to the computer case body 1.

In some embodiments, one side of the second support member 22 is bent to form a PCI bracket 222 vertically fixed to the first support member 21 and the second support member 22. Two ends of the PCI bracket 222 away from the first support member 21 and the second support member 22 are provided with third fixing holes 2221, and the computer case body 1 is provided with fourth fixing holes 12 that match with the third fixing holes 2221. By threading the third fixing holes 2221 and the fourth fixing boles 12 with bolts, the PCI bracket 222 is fixed to the computer case body 1, thereby better fixing the graphics card holder 2 to the computer case body 1.

In some embodiments, the PCI bracket 222 is provided with at least two PCI card slots 223, the PCI bracket 222 is provided with at least two first connection holes 2222, and the PCI card slot 223 is provided with second connection holes 2231. The number and positions of the first connection holes 2222 are corresponded to those of the second connection holes 2231. In an implementation mode, the PCI bracket 222 is provided with four first connection holes 2222, and there are four PCI card slots 223. Bach PCI card slot 223 is provided with one second connection hole 2231. The PCI card slot 223 is fixed to the PCI bracket 222 by threading bolts through the first connection holes 2222 and the second connection holes 2231.

In some implementations, the computer case body 1 is provided with at least one transparent side panel. After the graphics card is placed vertically, the colorful and cool fan on one side of the graphics card is visually visible through the transparent side panel, thereby rendering the product have a sense of technology. The colorful and cool fan is more likely to attract the attention and purchasing desire of the public, indirectly increasing product sales.

Working method, in an initial state, there is no graphics card holder 2 installed on the computer case. The graphics card holder 2 needs to be installed on the computer case body 1 first. First, the first fixing hole 231 and the second fixing hole 11 are threaded with bolts to fix the third support member 23 on the computer case body 1. Then, the third fixing hole 2221 and the fourth fixing hole 12 are threaded with bolts to fix the PCI bracket 222 on the computer case body 1. Finally, the PCI card slot 223 is fixedly connected to the PCI bracket 222 through the first connection holes 2222 and the second connection holes 2231, thereby completing an installation of the graphics card holder 2.

Finally, one side of the graphics card is placed with a fan facing away from the motherboard of the computer case vertically on the second support member 22, so that one end of the graphics card adapter cable 221 fixed on the second support member 22 is connected to the graphics card bracket, and adjust the position of the fixing piece 211 on the sliding groove 213, so that one side of the fixing member 211 provided with the graphics card fixing hole 2112 is tightly attached to the side of the graphics card, and then bolts are used to thread the graphics card fixing hole 2112 and the corresponding hole on the graphics card to fix and connect the graphics card to the fixing member 211; the other end of the graphics card adapter cable 221 is connected through the threading port 212 to the graphics card slot on the computer case motherboard, thereby completing an installation of the graphics card.

In a description of the embodiments of the present disclosure, it should be understood that orientation or position relationship indicated with terms "up", "down", "front", "back", "left", "right", "straight", "horizontal", "center", "top", are based on the orientation or position relationship shown in the accompanying drawings, only for a convenience of describing the present disclosure and simplifying the description, and does not indicate or imply that the device or component referred to must have a specific orientation, be constructed and operated in a specific orientation, and therefore cannot be understood as a limitation of the present disclosure. Where "inner side" refers to the internal or enclosed area or space. "Peripheral" refers to the area around a specific component or region.

In the description of the embodiments of the present disclosure, terms "first", "second", "third", and "fourth" are only used for a descriptive purpose and cannot be understood as indicating or implying relative importance or implying the number of technical features indicated. Therefore, features that are limited to "first", "second", "third", and "fourth" may explicitly or implicitly include one or more of these features. In the description of the present disclosure, unless otherwise specified, the meaning of "multiple" refers to two or more.

In the description of the embodiments of the present disclosure, it should be noted that unless otherwise specified and limited, terms "installation", "connection to", "connection with", and "assembly" should be broadly understood, for example, it can be a fixed connection, a detachable connection, or an integrated connection; it can be directly connected, indirectly connected through an intermediate medium, or connected internally between two components. For those skilled in the art, specific meanings of the above terms in the present disclosure can be understood in specific situations.

Although the embodiments of the present disclosure have been shown and described, it will be understood by those skilled in the art that various changes, modifications, substitutions, and variations can be made to these embodiments without departing from the principles and spirit of the present disclosure. The scope of the present disclosure is limited by the appended claims and their equivalents.

What is claimed is:

1. A computer case with a graphics card holder, comprising a computer case body and a graphics card holder,
wherein the graphics card holder comprises a first support member, a second support member, and a third support member;
the first support member is slidably connected to a fixing member, the second support member is vertically provided at one end of the first support member, the second support member is provided with a graphics card adapter cable, the third support member is vertically provided on one side of the first support member, and one side of the third support member away from the first support member is fixedly connected to the computer case body;
wherein the fixing member is integrally formed and bent to form a right angle, at least two sliding holes are provided on one side of the fixing member, and a graphics card fixing hole is provided on the other side;
wherein at least two parallel sliding grooves are provided on one side of the first support member near the third support member, and number and positions of the sliding grooves are corresponding to those of the sliding holes.

2. The computer case with a graphics card holder according to claim 1, wherein the second support member is a right-angled trapezoidal structure, and one right-angled side of the second support member is connected to the first support member.

3. The computer case with a graphics card holder according to claim 2, wherein one side of the second support member is bent to form a PCI bracket that is vertically fixed to the first support member and the second support member,
two ends of the PCI bracket away from the first support member and the second support member are provided with third fixing holes,
the computer case body is provided with fourth fixing holes that match with the third fixing holes.

4. The computer case with a graphics card holder according to claim 3, wherein the PCI bracket is provided with at least two PCI card slots, the PCI bracket is further provided with at least two first connection holes,
the PCI card slot is provided with second connection holes, and number and positions of first connection holes are correspond to those of the second connection holes.

5. The computer case with a graphics card holder according to claim 1, wherein a threading port with a size larger than the graphics card adapter cable is provided on one side of the first support member near the second support member.

6. The computer case with a graphics card holder according to claim 1, wherein a distance between the first support member and a computer case motherboard is 4 cm to 8 cm.

7. The computer case with a graphics card holder according to claim 1, wherein one side of the third support member away from the first support member is provided with a first fixing hole, and the computer case body is provided with a second fixing hole corresponding to the first fixing hole.

8. The computer case with a graphics card holder according to claim 1, wherein the computer case body is provided with at least one transparent side panel.

* * * * *